US009107021B2

(12) United States Patent
Florencio et al.

(10) Patent No.: US 9,107,021 B2
(45) Date of Patent: Aug. 11, 2015

(54) AUDIO SPATIALIZATION USING REFLECTIVE ROOM MODEL

(75) Inventors: Dinei A. Florencio, Redmond, WA (US); Cha Zhang, Sammamish, WA (US); Myung-Suk Song, Seoul (KR)

(73) Assignee: Microsoft Technology Licensing, LLC, Redmond, WA (US)

( * ) Notice: Subject to any disclaimer, the term of this patent is extended or adjusted under 35 U.S.C. 154(b) by 1088 days.

(21) Appl. No.: 12/772,014

(22) Filed: Apr. 30, 2010

(65) Prior Publication Data

US 2011/0268281 A1 Nov. 3, 2011

(51) Int. Cl.
*H04S 7/00* (2006.01)
*H04S 1/00* (2006.01)
*G06F 17/50* (2006.01)

(52) U.S. Cl.
CPC ............. *H04S 7/302* (2013.01); *H04S 1/007* (2013.01); *G06F 17/5009* (2013.01); *H04R 2420/01* (2013.01); *H04S 7/303* (2013.01); *H04S 7/305* (2013.01)

(58) Field of Classification Search
CPC ......... H04S 7/302; H04S 7/303; H04S 7/305; H04S 2420/01; H04S 2400/01; H04S 1/002; H04R 5/02; H04R 5/027; H04R 2205/024; G06F 17/5009
USPC ......... 381/17, 26, 58, 59, 66, 94.1–94.3, 303, 381/310
See application file for complete search history.

(56) References Cited

U.S. PATENT DOCUMENTS

| | | | |
|---|---|---|---|
| 5,511,129 A * | 4/1996 | Craven et al. ................. 381/103 |
| 5,742,689 A | 4/1998 | Tucker |
| 5,862,227 A * | 1/1999 | Orduna-Bustamante et al. ............................. 381/17 |
| 6,243,476 B1 * | 6/2001 | Gardner ....................... 381/303 |
| 6,449,368 B1 * | 9/2002 | Davis et al. ....................... 381/1 |
| 6,633,648 B1 | 10/2003 | Bauck |
| 6,738,479 B1 * | 5/2004 | Sibbald et al. .................. 381/17 |
| 6,990,205 B1 * | 1/2006 | Chen ............................... 381/17 |
| 7,123,731 B2 * | 10/2006 | Cohen et al. ................... 381/303 |
| 7,333,622 B2 | 2/2008 | Algazi |
| 7,415,123 B2 | 8/2008 | Ballas |

(Continued)

OTHER PUBLICATIONS

Gardner; 3-D Audio Using Loudspeakers—Published Date: Sep. 1997; Kluwer Academic Thesis (Ph. D.)—Massachusetts Institute of Technology, Program in Media Arts & Sciences; Includes bibliographical references (p. 145-153).

(Continued)

*Primary Examiner* — Davetta W Goins
*Assistant Examiner* — Daniel Sellers
(74) *Attorney, Agent, or Firm* — Sandy Swain; Judy Yee; Micky Minhas

(57) ABSTRACT

Described are systems and methods performed by computer to reduce crosstalk produced by loudspeakers when rendering binaural sound that is emitted from the loudspeakers into a room. The room may have sound-reflecting surfaces that reflect some of the sound produced by the loudspeakers. To reduce crosstalk, a room model stored by the computer, is accessed. The room model models at least sound reflected by one or more of the physical surfaces. The room model is used to calculate a model of an audio channel from the loudspeakers to a listener. The model of the audio channel models sound transmission from the loudspeakers to the listener. The computer uses the model of the audio channel to cancel crosstalk from the loudspeakers when rendering the binaural sound.

20 Claims, 4 Drawing Sheets

(56) References Cited

U.S. PATENT DOCUMENTS

| | | | |
|---|---|---|---|
| 7,536,017 B2* | 5/2009 | Sakurai et al. | 381/17 |
| 7,688,678 B2* | 3/2010 | Larsen et al. | 367/99 |
| 8,126,172 B2* | 2/2012 | Horbach et al. | 381/303 |
| 8,155,323 B2* | 4/2012 | Chabanne | 381/17 |
| 2002/0067835 A1* | 6/2002 | Vatter | 381/58 |
| 2003/0007648 A1* | 1/2003 | Currell | 381/61 |
| 2007/0127730 A1* | 6/2007 | Kim et al. | 381/60 |
| 2007/0230724 A1* | 10/2007 | Konagai et al. | 381/303 |
| 2008/0226084 A1* | 9/2008 | Konagai et al. | 381/17 |
| 2009/0052680 A1* | 2/2009 | Wang et al. | 381/59 |
| 2009/0103738 A1 | 4/2009 | Faure | |
| 2010/0042925 A1* | 2/2010 | DeMartin et al. | 715/716 |
| 2010/0329489 A1* | 12/2010 | Karaoguz | 381/307 |

OTHER PUBLICATIONS

Binaural Environment Modelling—Retrieved Date: Jan. 27, 2010; http://www.sonicemotion.com/ch/images/PDF/M3S_phones.pdf.

Cooper et al.; Prospects for transaural recording; J. Audio Eng. Soc., vol. 37, pp. 3-19, 1989.

Bauck et al.; Generalized transaural stereo and applications; J. Audio Eng. Soc., vol. 44, pp. 683-705, 1996.

Nelson et al.; Adaptive inverse filters for stereophonic sound reproduction; Signal Processing, IEEE Transactions on , vol. 40, No. 7, pp. 1621-1632, 1992.

Mouchtaris et al.; Inverse filter design for immersive audio rendering over loudspeakers; Multimedia, IEEE Transactions on , vol. 2, No. 2, pp. 77-87, 2000.

Kirkeby et al.; Virtual source imaging using the stereo dipole; Proc. 103th Convention of the Audio Eng. Soc., 1997.

Toole; Loudspeaker Measurements and Their Relationship to Listener Preferences Part 1*; J.AudioEng.Soc.,vol. 34, No. 4,Apr. 1986.

Ba et al.; L1 Regularized Room Modeling With Compact Microphone Arrays; Acoustics Speech and Signal Processing (ICASSP), 2010 IEEE International Conference on Mar. 14-19, 2010 On pp. 157-160.

Mouchtaris et al.; Headrelated transfer function synthesis for immersive audio; IEEE Second Workshop on Multimedia Signal Processing, pp. 155-160, 1998.

Kyriakakis et al.; Immersive audio for the desktop; Proc. IEEE ICASSP, vol. 6, pp. 3753-3756, 1998.

Lopez et al.; Measurement of cross-talk cancellation and equalization zones in 3-D sound reproduction under real listening conditions; AES 16th International Conference, 1999.

Gardner et al.; HRTF Measurements of a KEMAR Dummy Head Microphone; Date Published: May 1994.

Lim et al.; Multirate adaptive filtering for immersive audio; Proc. IEEE ICASSP, vol. 5, pp. 3357 3360, 2001.

Kim et al.; Adaptive Virtual Surround Sound Rendering System for an Arbitrary Listening Position; J. Audio Eng. Soc., vol. 56, No. 4, 2008.

Allen et al.; Image method for efficiently simulating small-room acoustics; Acoustical Society of America, vol. 65, No. 4 (1979), pp. 943-950.

Foo et al.; Three dimensional sound localisation with multiple loudspeakers using a pair-wise association paradigm with embedded HRTFs; The 104th AES Convention, 1998.

* cited by examiner

AUDIO SPATIALIZATION USING REFLECTIVE ROOM MODEL

RELATED APPLICATIONS

This patent/application is related to U.S. patent application Ser. No. 12/824,248, filed Jun. 28, 2010, titled "Sound Source Localization Based On Early Reflections And Room Estimation".

BACKGROUND

Audio spatialization refers to techniques that synthesize a virtual sound image in order for a listener to feel as though the synthesized sound originated by an actual source located at a certain position. Spatial audio differs from ordinary stereo in that spatialized audio may be perceived to come from a particular location relative to the listener.

Spatialized audio can be rendered by headphones or loudspeakers. Loudspeakers, however, lack practical inconveniences of headphones and are therefore preferred for certain applications, for example desktop environments, telepresence applications, etc. However, the quality of loudspeaker-based audio spatialization is generally lower, as it suffers from crosstalk caused by the contralateral audio paths (e.g., right speaker to left ear, left speaker to right ear) from the loudspeakers to the listener's ears. Such crosstalk often degrades the 3D cues of the spatialized audio (i.e., attributes of the sound that cause perception of space may be affected).

To address this problem, crosstalk cancellation techniques have been studied with the goal of eliminating or minimizing crosstalk by equalizing the acoustic transfer function between the loudspeakers and the listener's ear drums. To effectively cancel crosstalk, it is helpful to model the acoustic path from the loudspeaker to the listener's position. Such an acoustic path model is often represented as a matrix of transfer functions. Several methods to model transfer functions have been proposed. A simple approach is to use a free-field model, where the sound field radiated from a monopole in a free-field is computed based on the distances from the sources to the observation points. Under the assumption that the human head can be modeled as a sphere, the expression for the sound field produced by a sound wave impinging on a rigid sphere has been formulated. An improvement over the spherical head model has been to adopt a head related transfer function (HRTF). An HRTF is often measured in an anechoic chamber with dummy-heads to provide an acoustically realistic model of a human listener. Adding the direct path delay and attenuation of the sound wave, one can calculate accurate transfer functions between the loudspeakers and the listener and use the models for crosstalk cancellation.

Even with an HRTF or the like, crosstalk can be significant. Real-world environments with walls are often reverberant, which creates additional challenges for crosstalk cancellation. Conventional crosstalk cancellation degrades in a realistic listening room in which reverberation exists in general. Solutions such as careful layout (to improve direct-path dominance) and designing transfer functions that take into account room reverberation have been ineffective or impractical. Note that techniques that place a microphone at the center of user location (or sweet spot), will help with general room equalization, but it will not provide enough precision to help with crosstalk cancellation, as the RIR (room impulse response) will change significantly even with a few inches change in users' position. As of yet, there has been no practical approach to crosstalk cancellation that takes room reverberation into consideration.

Techniques related to audio crosstalk cancellation that involve practicable room modeling are discussed below.

SUMMARY

The following summary is included only to introduce some concepts discussed in the Detailed Description below. This summary is not comprehensive and is not intended to delineate the scope of the claimed subject matter, which is set forth by the claims presented at the end.

Computing systems and methods performed by computers may reduce crosstalk produced by loudspeakers when rendering binaural sound that is emitted from the loudspeakers into a room. The room may have a plurality of sound-reflecting surfaces that reflect some of the sound produced by the loudspeakers. To reduce crosstalk, a room model stored by the computer, is accessed. The room model models at least sound reflected by one or more of the physical surfaces. The room model is used to calculate a model of an audio channel from the loudspeakers to a listener. The model of the audio channel models sound transmission from the loudspeakers to the listener. The computer uses the model of the audio channel to cancel crosstalk from the loudspeakers when rendering the binaural sound.

Many of the attendant features will be explained below with reference to the following detailed description considered in connection with the accompanying drawings.

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Overview

Embodiments described below relate to crosstalk cancellation. Techniques are described which explicitly consider room reverberation by using room models that model a room with a number of planar reflectors such as walls or ceilings. Such room models can be estimated with approaches such as described by D. Ba, F. Ribeiro, C. Zhang and D. Florencio in "L1 Regularized Room Modeling With Compact Microphone Arrays" (ICASSP 2010). Instead of modeling the room by directly measuring or sensing the room impulse response (RIR), the room may be modeled and the RIR then obtained from the room model. A typical RIR changes with even minor movement of the user's head, and re-computing the room model based on the prior RIR is not practical (as the RIR itself does not contain enough information to allow a direct computation of the new RIR). However, an estimate of a new RIR per some new user stance can be quickly obtained from the room model ("stance" and "pose" as used herein refer to position and orientation of the user, or any changeable spatial characteristic of the user that can affect perception of audio spatialization). By using the new estimated RIR, and by applying an equalization technique, the audio channel separation can be improved, thus improving the quality of reproduced spatialized sound.

It should be noted that experiments have verified that some implementations of embodiments described herein estimate RIR in real time with accuracy (i.e., close to the true RIR) sufficient to yield reasonable results. By applying an equalization technique to the estimated acoustic transfer function that includes the reflections caused by the walls/ceilings of the listening room, the listener's performance, when tested, on estimating the virtual source position was shown to be substantially improved, as verified by actual subjective listening tests.

Description will continue with an overview of binaural audio systems followed by description of room-model based binaural audio systems.

Binaural Audio Systems

Figure 1:
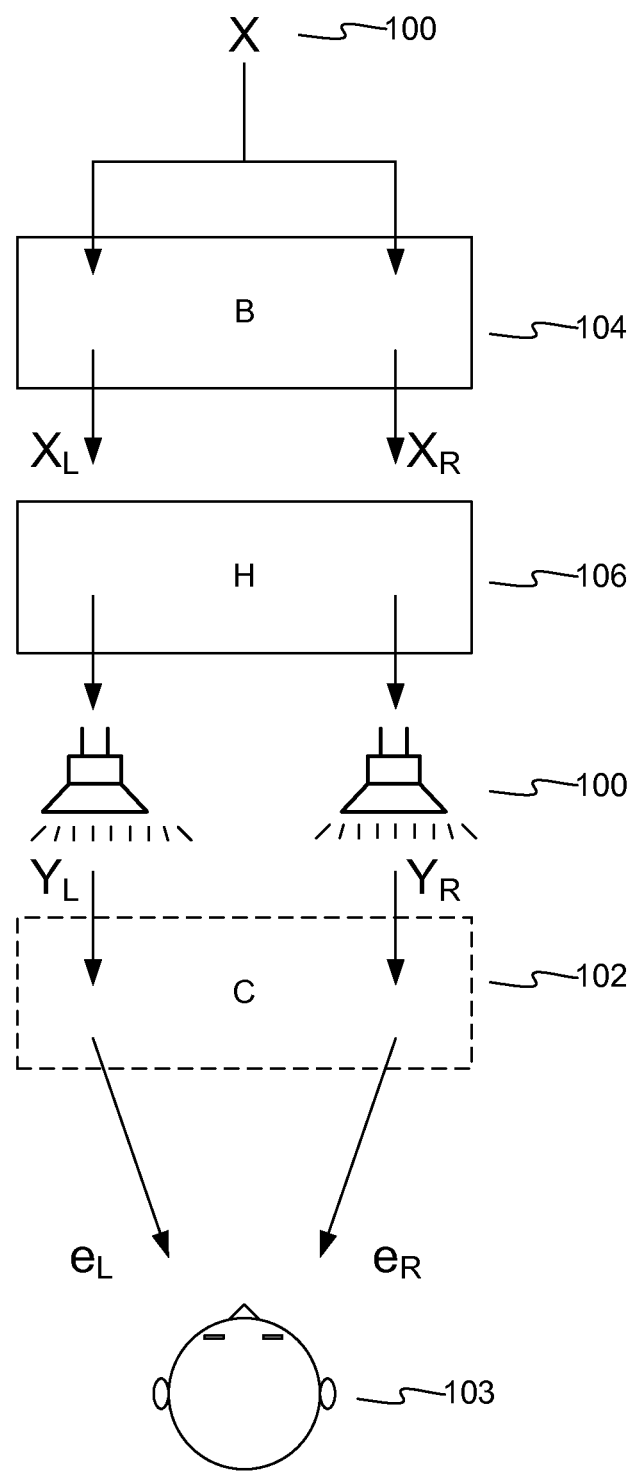
FIG. 1 shows a binaural audio playback system with two loudspeakers.

FIG. 1 shows a binaural audio playback system with two loudspeakers 100. A transmission path or acoustic channel 102 (referred as "C" in mathematical nomenclature below) between the loudspeakers 100 and the ears of listener 103 is assumed to be known (i.e., given by one of many practical tracking systems). The binaural audio system itself includes two major blocks: binaural synthesizer 104 (also referred to as "B") and crosstalk canceller 106 (also referred to as "H"). The binaural synthesizer is to produce sounds that should be heard by the ear drums of listener 103. In other words, the signals $e_L$ and $e_R$ at the listener's ears shall be assumed to be equal to the binaural synthesizer 104 output $X_L$ and $X_R$. The binaural synthesizer 104 takes a binaural signal (e.g., the recorded or captured or synthetically generated sound) and produces the binaural audio signal that will drive speakers to produce binaural sound. The crosstalk canceller 106 is to equalize the effect of the transmission path 102 by taking an inversion of the C matrix, or an approximation thereof.

With these components in mind, before addressing binaural synthesis (by binaural synthesizer 104) and crosstalk cancellation (by crosstalk canceller 106) in the next two paragraphs, respectively, some additional overview is provided. To derive a quality crosstalk canceller 106 (filter H), it is helpful to know some estimation, whether derived or measured, of C. Techniques to derive C where certain assumptions about C (e.g., no reflection from walls and only direct path from speaker to ear) are made, and techniques of actually measuring C rather than deriving C, or measuring channel response in a real room (which will include reflection) are not robust against user movement. When the user moves his or her head, C, whether derived or measured, should change accordingly. By building a model of a room that assumes a number of reflectors (walls, ceilings, etc.), reflection is modeled, and audio channel C can be dynamically calculated based on head orientation/direction. Thus, wherever the user moves or faces it is possible to calculate C (with reasonable approximation). Room modeling alone can be done in a number of ways, including the one described in the above-mentioned related patent application. Described herein are ways to use these room models to improve real-time estimates of audio channel C by incorporating a room model (which models reflection) into the process of calculating a model of audio channel C based on changing real-time user stance.

Regarding binaural synthesis, the binaural synthesizer 104 synthesizes one or multiple virtual sound images at different locations around the listener using 3D audio cues. There are a number of well-known binaural cues for the human auditory system to localize sounds in 3D, such as the interaural time difference (ITD) and the interaural intensity difference (IID). In one embodiment described next, HRTF techniques will be used to synthesize binaural signals from a monaural source (for additional understanding, see Mouchtaris et al., "Head-related transfer function synthesis for immersive audio," IEEE Second Workshop on Multimedia Signal Processing, pp. 155-160, 1998; and Gardner, "3-D audio using loudspeakers," Ph.D. thesis, MIT, 1997). Specifically, a monaural input signal can be filtered with the impulse response of the HRTF for a given angle of incidence as:

$$x = \begin{bmatrix} x_L \\ x_R \end{bmatrix} = \begin{bmatrix} B_L \\ B_R \end{bmatrix} x = Bx \quad (1)$$

where x is the monaural input signal, and $B_L$ and $B_R$ are the HRTFs between the listener 103's ears and the desired virtual source. The outputs of binaural synthesis are the signals $X_L$ and $X_R$ that should be reproduced at the listener 103's ear drums.

Figure 2:
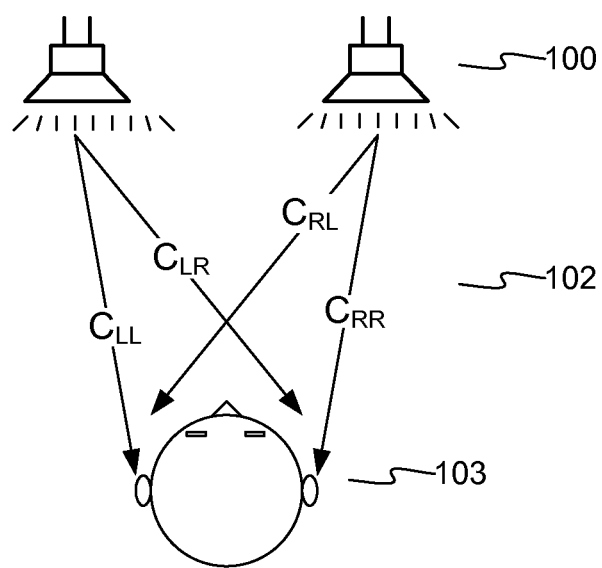
FIG. 2 shows components (represented by arrows) of an acoustic path between loudspeakers and a listener's ears.

Regarding crosstalk cancellation as performed by crosstalk canceller 106, FIG. 2 shows components (represented by arrows) of acoustic path 102 between loudspeakers 100 and listener 103's ears. The acoustic path 102 is defined as the acoustic transfer matrix C:

$$C = \begin{bmatrix} C_{LL} & C_{RL} \\ C_{LR} & C_{RR} \end{bmatrix} \quad (2)$$

where $C_{LL}$ is the transfer function from the left speaker to the left ear, $C_{RR}$ is the transfer function from the right speaker to the right ear, and $C_{RL}$ and $C_{LR}$ are the transfer functions from contralateral speakers, which are referred to as "crosstalks"; the components of the acoustic path that go from a speaker to the relatively distant ear. For headphone applications, the two channels are completely separated, hence both $C_{RL}$ and $C_{LR}$ are zero. The binaural synthesis step without crosstalk cancellation will generate satisfactory 3D auditory experiences for the user. However, for loudspeaker applications, the crosstalks $C_{RL}$ and $C_{LR}$ will disrupt the 3D cues of the binaural signal. Thus crosstalk canceller 106 is inserted to equalize the transmission path between the loudspeakers 100 and the listener 103 by reducing $C_{RL}$ and $C_{LR}$.

The crosstalk canceller 106 or matrix H can be calculated by taking the inverse of the acoustic transfer matrix C, as denoted by:

$$H = C^{-1} \quad (3)$$
$$= \begin{bmatrix} C_{LL} & C_{RL} \\ C_{LR} & C_{RR} \end{bmatrix}^{-1}$$
$$= \begin{bmatrix} C_{RR} & -C_{RL} \\ -C_{LR} & C_{LL} \end{bmatrix} \frac{1}{D},$$

where D denotes the determinant of the matrix C. Note that the listener's head position and orientation is assumed to be known, e.g., given by various trackers described elsewhere. In addition, since the acoustic transfer functions derived from the HRTFs have non-minimum phase characteristics in general, it is unstable to directly compute H from the inverse of C. Instead, H can be adaptively obtained by the least mean square (LMS) method.

Binaural Audio System with Room Modeling

As mentioned in the Background, real-world environments are often reverberant, which complicates the computation of the acoustic transfer matrix C. To include the indirect paths from the loudspeakers to the listener, the room impulse response may be physically measured. However, the room impulse response may vary significantly as the listener moves around, which renders such measurement based schemes impractical.

Reverberation's role in sound quality, for example in immersive audio systems, is mostly attributable to discrete early reflections along the sound path. That is, the first surface(s) that a sound wave encounters are more significant than secondary reflections. Psychoacoustic experiments have confirmed that early reflections are the dominant source of frequency response anomalies when other contributing causes are accounted for. Techniques described next—for modeling such early reflections explicitly using a simplified room model—may be efficient enough to model moving listeners in a room in real time; the early reflections can be computed through the image method given the listener's position at any instance. For discussion of the image method, consult Allen et al., "Image method for efficiently simulating small-room acoustics", Acoustical Society of America, Vol. 65, No. 4 (1979), pp. 943-950.

Room Model

Rooms are potentially complex environments, which may contain furniture, people, partial walls, doors, windows, non-standard corners, etc. However, rooms often have a few generic attributes in common. For instance, many rooms (or cubicles) have four walls, a ceiling and a floor; the floor is leveled, and the ceiling parallel to the floor; walls are vertical, straight, and extend from floor to ceiling and from adjoining wall to adjoining wall, etc. For personal binaural systems on the desktop, telepresence systems, and the like, two loudspeakers are often placed on an office table, about 90 cm high. In addition, many objects that seem visually important are small enough that they may effectively be acoustically transparent for most frequencies of interest. Based on these observations, a typical room may be modeled with 6 planar surfaces: 4 walls, the ceiling and the floor (or the table if the main reflection from below is due to the table). Other configurations with more or fewer surfaces may be readily implemented in view of the following discussion of a 6-surface model.

Each planar surface of the room is modeled with its 3D position and reflection coefficient. The 3D positions can be measured by a tape, 3D distance sensor, etc., and the reflection coefficients can be roughly set by user input or measured. While any measurements or numbers may be used, of course the closer such numbers are to the actual physical room, the better the results. Recently, a scheme has been proposed to actively probe a room by emitting a known signal from a known location, and then estimate the room geometry and reflection coefficients by examining the reflections received at a compact microphone array (see Ba et al., "L1 Regularized Room Modeling With Compact Microphone Arrays" (ICASSP 2010)). Any technique for estimating a room's configuration or reflective surfaces may be used. For instance, a user may select pre-configured templates or otherwise input information about the room, or camera(s) may be used to infer room geometry or surface types. In the following discussion, it will be assumed that a simplified planar room model is given, such as might be found in a test environment. The techniques for a generic room may be readily adapted to any room configuration.

Binaural Audio System with Room Model

Figure 3:
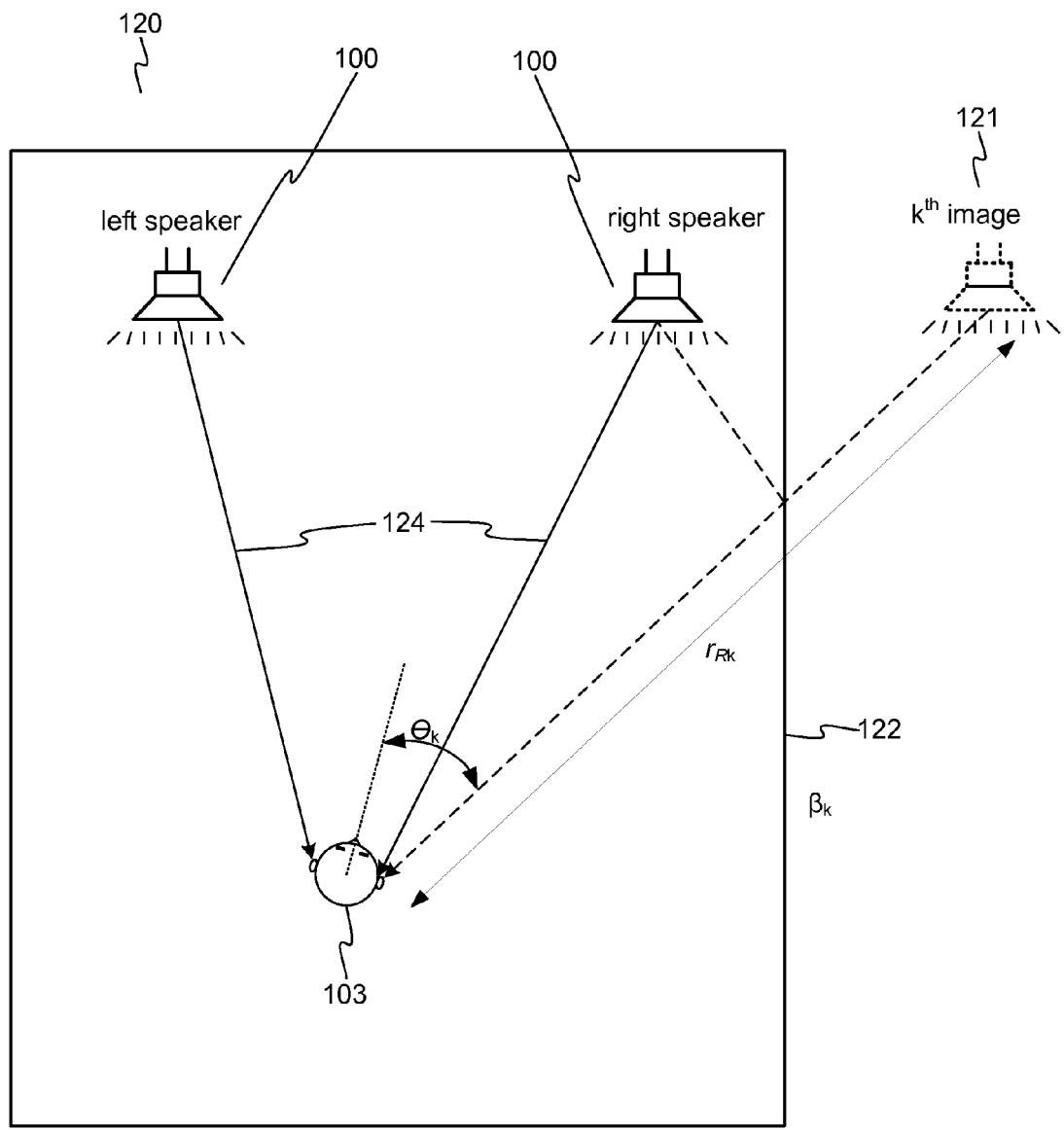
FIG. 3 shows an acoustic model for modeling reverberation.

FIG. 3 shows an acoustic model for modeling reverberation. When a sound source (e.g., loudspeaker) is placed inside a room 120, the sound wave from the sound source at an arbitrary location in the room 120 can be represented by the superposition of a number of reflected sound waves. If the room 120 contains only planar surfaces, the reflections can be modeled as direct sounds from various phantom or image sound sources 121, which are placed on the far side of the walls 122 surrounding the real source (i.e., placed where the reflected would be perceived to originate). More complex models may be used. For example, double reflections (or images of images themselves) may be included in the model, as well as higher order reflections.

As shown in FIG. 3, the acoustic paths from one of the loudspeakers 100 to the listener 103's ear drums can be represented by the summation of the impulse responses 124 from the actual source (e.g., right loudspeaker 100) and the image sources 121 reflected by the 6 walls 122 surrounding the listener:

$$C_{mn} = \sum_{k=0}^{N} \frac{\beta_k}{r_{mk}} z^{-\Delta_{mk}} C_{mn}(\theta_k), \; m, n \in \{L, R\} \quad (4)$$

where N is the total number of planar surfaces (while the first reflections of the walls are described herein, extending to multiple reflections or curved surfaces is straightforward). In formula (4), k denotes the index of the images 121 of the loudspeakers 100, and the actual loudspeaker 100 is represented as k=0. Also, m and n represent the indices for the left or right loudspeakers 100 and left or right listener 103's ears, respectively. Variables $\beta_k$, $r_{mk}$, and $\Delta_{mk}$ denote the reflection coefficient for the $k^{th}$ wall, the distance between the $k^{th}$ image of the m loudspeaker and the listener, and the delay from the $k^{th}$ image of the m loudspeaker to the listener, respectively. Furthermore, $$\Delta_{mk} = \frac{r_{mk}}{c},$$

where c is the speed of sound. The head size is assumed to be much smaller than the distance between the image sources and the listener, hence both ears share the same $r_{mk}$. The term $C_{mn}(\theta k)$ is the HRTF from the $k^{th}$ image of m loudspeaker to n ear. For instance, $C_{LL}(\theta_k)$ is the HRTF of the $k^{th}$ image of the left speaker to the left ear. This way of modeling the RIR for sound spatialization may allow taking into consideration the HRTF in the direction of each of the reflected sounds. Furthermore, traditional RIR modeling techniques based on direct RIR interpolation cannot take into consideration the user's head position or orientation.

In short, the acoustic transfer function from m speaker to n ear is the summation of $C_{mn}(\theta k)$ weighted by $\beta k$, delayed by $\Delta_{mk}$, and attenuated by distance $r_{mk}$. The overall acoustic transfer matrix C can be written as:

$$C = \begin{bmatrix} \sum_{k=0}^{N} \frac{\beta_k}{r_{LK}} z^{-\Delta_{LK}} C_{LL}(\theta_k) & \sum_{k=0}^{N} \frac{\beta_k}{r_{RK}} z^{-\Delta_{LK}} C_{RL}(\theta_k) \\ \sum_{k=0}^{N} \frac{\beta_k}{r_{LK}} z^{-\Delta_{LK}} C_{LR}(\theta_K) & \sum_{k=0}^{N} \frac{\beta_k}{r_{RK}} z^{-\Delta_{Rk}} C_{RR}(\theta_k) \end{bmatrix} \quad (5)$$

Based on this calculated room impulse response, the crosstalk canceller matrix H can be computed using the LMS method. For explanation of the LMS method, see Nelson et al., "Adaptive inverse filters for stereophonic sound reproduction", Signal Processing, IEEE Transactions on, vol. 40, no. 7, pp. 1621-1632, 1992.

Figure 4:
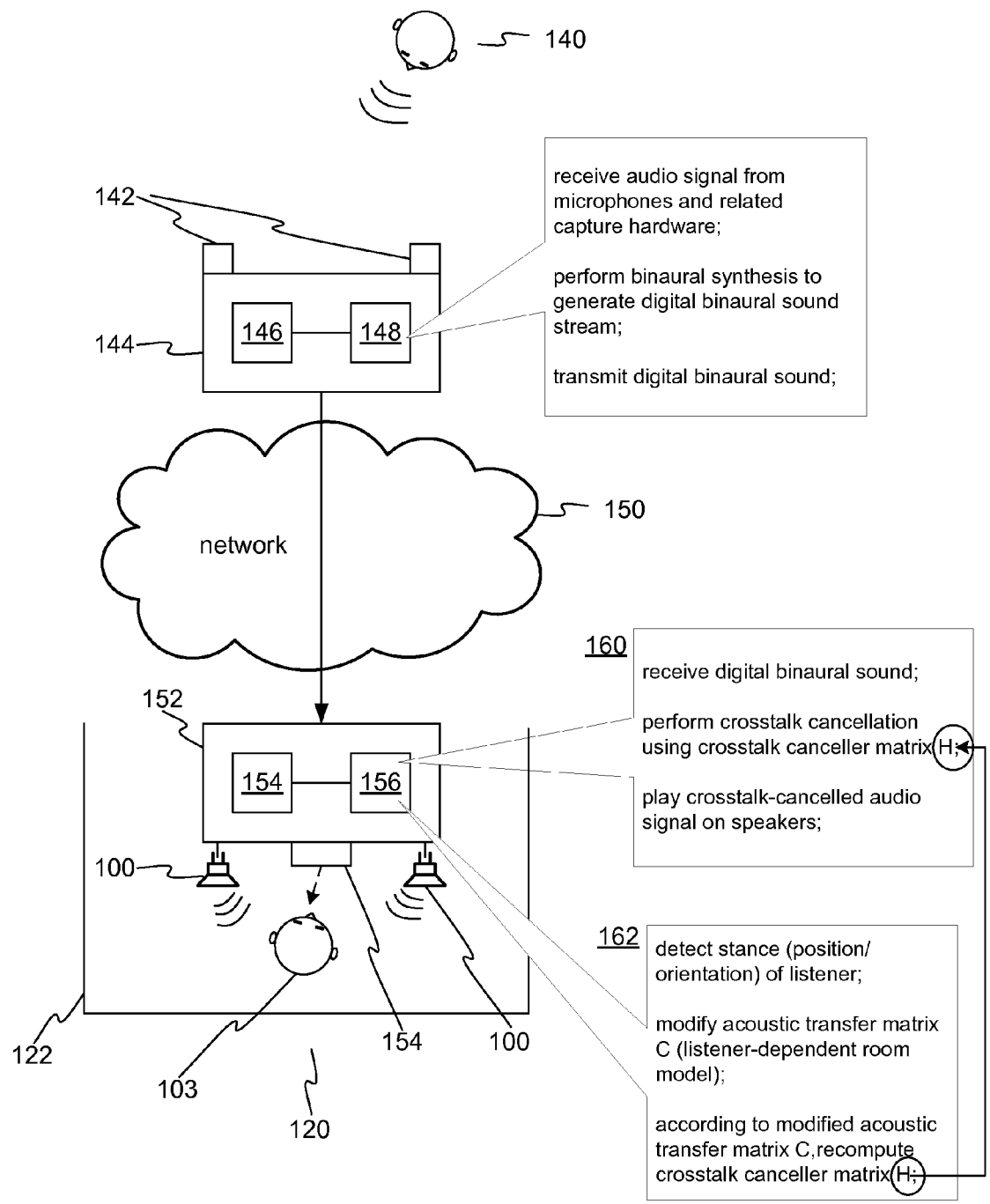
FIG. 4 shows a binaural communication system using room modeling.

FIG. 4 shows a binaural communication system using room modeling. A distant sound source, such as person 140, produces voice sound that is detected by microphones 142. The microphones provide a signal of the voice sound to a computer 144 (e.g., mobile phone, workstation, etc.) that has storage 146 and processor(s) 148 (e.g., CPU, and/or digital signal processor, etc). The storage (dynamic memory, removable media, and/or static storage, etc.) and the processor(s) 148 cooperate to perform a process 150 for synthesizing and transmitting the audio signal. In particular, process 150 involves receiving the audio signal and performing binaural synthesis to generate a digital binaural sound stream, which may be encoded for transmission and then transmitted using known protocols over a network 150.

The encoded binaural audio sound stream is received at computer 152 in room 120. The computer 152 has loudspeakers 100 and a detecting component 154. The detecting component 154 may be any type of sensor (camera, microphone array, etc.) that is able to detect the location and/or orientation of listener 103. The computer 152 has processor(s) 156 (e.g., digital signal processor, general purpose CPU, etc.) and storage 158 (removable media, dynamic memory, static memory, and/or disk drive, etc.). The computer 152 may be configured to perform process 160 and process 162. Provided with the information disclosed herein, including the formulas described above, one of ordinary skill in the art of computer programming will be able to write and compile/execute source code that will cause the processor(s) 156 and storage 158 to perform process 160 and process 162 as well as other steps described herein, for example by using tools, development environments, compilers, etc. that will interpret/translate the source code into processor instructions (or intermediate instructions that are in turn converted to machine/processor instructions). It will also be appreciated that the mathematical nomenclature used herein is a convenient way to describe the properties that computer 152 may have when programmed accordingly. That is, the methods described herein are implemented on computers but are best described using mathematical language.

Referring again to process 160, which may be continuously repeated for real-time effect, the encoded and transmitted binaural audio stream is received, unpacked, and converted to suitable form for signal processing. A binaural synthesis component may generate a binaural sound signal that is passed to a crosstalk canceller. The crosstalk canceller uses a crosstalk canceller matrix H (discussed above) to cancel crosstalk in a way that may take into account sound reflection and stance of listener 103 (known by the detecting component 154 which continuously reports the stance of listener 103). The audio output of the sound canceller is used to produce binaural sound from loudspeakers 100.

Process 162, which may also be repeated continuously or at suitable intervals for real-time effect, may involve obtaining the detected stance of the listener 103. Then, the acoustic transfer matrix C is calculated (modified, re-calculated, etc.) based on the current stance and the room model. As described above, the acoustic transfer matrix C is then used to calculate an updated/modified crosstalk canceller matrix H used by the crosstalk canceller in process 160.

While binaural sound is described above, the techniques can be readily extended to 5.1 channel sound, or more. As used herein, "binaural" should be understood to include dimensions of sound from two and higher. The binaural sound production and reproduction may also be configured to continuously steer the audio sweet spot to the current location of the listener 103, thus tracking the sweet spot to the user's movement. While a single-reflection model is described, more complex room models with multiple reflections may also be used, i.e., sounds that bounce off multiple model surfaces. In the case of multiple users, the same techniques may be used. For example, when 3 users are in the room with 6 speakers, there would be 6×(3×2)=32 transfer functions, i.e., a different transfer function between each speaker and each ear. A technique of "room equalization" may be used to have the room model take into consideration information such as . . . this technique will mathematically predict that, if the room has a certain frequency it will show up in the equation. Where there are more than two users or listeners, the number of loudspeakers may need to be increased. For N users, at least 2N loudspeakers might be needed. In such a case, the transfer function C will be a 2N×2N matrix, whose inversion will be the crosstalk canceller matrix, which can be used for equalization. Embodiments discussed above may be used for any system that renders binaural sound. For instance, a game may fabricate completely synthetic binaural sound; rendering/playing binaural sound is not limited to reproduction of captured real sound.

CONCLUSION

Embodiments and features discussed above can be realized in the form of information stored in volatile or non-volatile computer or device readable media. This is deemed to include at least media such as optical storage (e.g., CD-ROM), magnetic media, flash ROM, or any current or future means of storing digital information. The stored information can be in the form of machine executable instructions (e.g., compiled executable binary code), source code, bytecode, or any other information that can be used to enable or configure computing devices to perform the various embodiments discussed above. This is also deemed to include at least volatile memory such as RAM and/or virtual memory storing information such as CPU instructions during execution of a program carrying out an embodiment, as well as non-volatile media storing information that allows a program or executable to be loaded and executed. The embodiments and features can be performed on any type of computing device, including portable devices, workstations, servers, mobile wireless devices, and so on.

The invention claimed is:

1. A method performed by a computer to reduce crosstalk produced by loudspeakers when rendering binaural sound that is emitted from the loudspeakers into a room, the room comprising a physical area with a plurality of sound-reflecting physical surfaces that reflect some of the sound produced by the loudspeakers, the reflected and un-reflected sound from the loudspeakers available to be heard by a listener if present in the room, the method comprising:

receiving positions and/or orientations of the listener;

accessing a static room model stored by the computer, the room model comprising indicia of planar surfaces, the room model able to model sound from positions of the loudspeakers reflected by one or more of the physical surfaces represented in the room model to arbitrary positions of the listener;

for each received position and/or orientation, using the room model to calculate, according to the received position and/or orientation of the listener, by the computer, a model of an audio channel from the loudspeakers to the listener, the model of the audio channel comprising an estimated room impulse response comprising a first component modeling sound transmission both from the loudspeakers directly to the listener and comprising a second component modeling sound transmission from the loudspeakers indirectly by reflection from the physical surfaces of the room; and for each computed model of the audio channel, using, by the computer, the first component of the model of the audio channel to cancel direct crosstalk from the loudspeakers and the second component of the model to cancel reflected crosstalk from the loudspeakers to render the binaural sound.

2. A method according to claim 1, wherein the modeled reflected sound corresponds to an image of a loudspeaker and a modeled surface that corresponds to a physical surface of the room.

3. A method according to claim 1, wherein the calculating the model of the audio channel from the loudspeakers to the listener is performed using information about the current position and/or orientation of the listener in the room.

4. A method according to claim 3, wherein the orientation and position of the listener is obtained by a video based head tracker.

5. A method according to claim 3, where the model of the audio channel takes into account a different HRTF (head related transfer function) in relation to each of the direct or reflected sounds, each HRTF corresponding to the distance and direction of arrival of each corresponding direct or reflected sound.

6. A method according to claim 1, wherein the model of the audio channel comprises an acoustic transfer matrix, and wherein the using the model of the audio channel to cancel crosstalk comprises computing an inverse of the acoustic transfer matrix.

7. A method according to claim 6, wherein the inverse of the acoustic transfer matrix is used to compute a crosstalk cancellation matrix, and the cancelling crosstalk is performed according to the crosstalk cancellation matrix.

8. A method according to claim 1, further comprising computing the room model by using sound data captured from a microphone array to infer geometry of the room.

9. A method according to claim 1, further comprising repeatedly determining the current position and orientation of the listener in the room and repeatedly using the different current positions and orientations that result from movement of the listener to repeatedly calculate new models of the audio channel, and repeatedly using the new models of the audio channel to perform the crosstalk cancellation.

10. One or more computer-readable storage apparatuses storing information that causes a computer to perform a process of reducing crosstalk sound produced when the computer renders binaural sound, wherein sound transmitted from a loudspeaker reaches a first ear of a listener and a second ear of the listener, the crosstalk sound comprising sound transmitted from the loudspeaker and reflected from a surface of a room to the second ear of the listener, the process comprising:

repeatedly accessing a room model stored by the computer and repeatedly accessing stance information stored by the computer to repeatedly compute estimated room impulse responses that includes a crosstalk cancellation function, the crosstalk cancellation function including a component to cancel an estimation of direct crosstalk and including a component to cancel an estimation of indirect crosstalk reflected by the room, the room model able to model reflection of sound from the loudspeaker to arbitrary positions of the listener, the room model not comprising a measured audio impulse response, the stance information comprising a current stance of the listener that is repeatedly updated as the listener moves; and repeatedly reducing the crosstalk sound by using the estimated room impulse response to generate a binaural audio signal as the stance of the listener changes, the speakers emitting sound corresponding to the generated binaural audio signal.

11. One or more computer-readable storage apparatuses according to claim 10, wherein the room model models reflected sound.

12. One or more computer-readable storage apparatuses according to claim 11, using the accessed room model and the stance information comprises computing an acoustic transfer matrix based on the accessed room model and the stance information, the acoustic transfer matrix modeling how sound is transmitted from the loudspeaker to the listener according to the current stance of the listener and according to reflection of crosstalk sound reflected from a surface to the listener.

13. One or more computer-readable storage apparatuses according to claim 12, further comprising computing an inverse of the acoustic transfer matrix, and based on the inverse of the acoustic transfer matrix, computing a crosstalk canceller matrix that is used to reduce the crosstalk sound when generating the binaural sound signal.

14. One or more computer-readable storage apparatuses according to claim 10, further comprising performing binaural synthesis on sound data to produce synthetic binaural sound data, and then performing the reducing of the crosstalk sound by performing crosstalk cancellation on the binaural sound data.

15. One or more computer-readable storage apparatuses according to claim 14, the room model modeling a ghost image of the loudspeaker, wherein the performing crosstalk cancellation comprises applying a matrix that includes one or more elements that are computed based on the image of the loudspeaker.

16. One or more computer-readable storage apparatuses according to claim 15, wherein the image comprises a modeled position of where the listener would perceive the loudspeaker to be when hearing the loudspeaker reflected to the listener by a surface modeled by the room model.

17. A computing device that produces binaural sound, the computing device comprising a processor and storage in communication with the processor and storing instructions for the processor, the computing device including loudspeakers in a room comprised of sound-reflecting surfaces, the loudspeakers emitting synthesized binaural sound that reflects off of the surfaces and then reaches ears of a person in the room, the computing device comprising:

a binaural synthesis module that generates a binaural sound signal;

a crosstalk cancellation module that receives the binaural sound signal and modifies the binaural sound signal by:
computing an estimated room impulse response comprising an acoustic transfer matrix that corresponds to acoustic indirect transfer from the loudspeakers to the reflective surfaces to the person and acoustic direct transfer from the loudspeakers to the person, the computing using a model representing the reflective surfaces such that the model can be used to compute sound reflection from the loudspeakers to arbitrary positions, using the acoustic transfer matrix to compute a crosstalk cancellation function that includes a component to cancel estimated direct crosstalk and includes a component to cancel estimated reflected crosstalk, and modifying the binaural sound signal generated by the binaural synthesis module according to the crosstalk cancellation function.

18. A computing device according to claim 17, the modifying the binaural sound signal according to the acoustic transfer matrix comprising: computing an inverse of the acoustic transfer matrix.

19. A computing device according to claim 18, further comprising computing a crosstalk cancellation matrix from the inverse of the acoustic transfer matrix, and applying the crosstalk cancellation matrix to the binaural sound signal to reduce the crosstalk sound.

20. A computing device according to claim 17, wherein the acoustic transfer matrix is computed based on stance information indicating a position and orientation of the person relative to the loudspeakers, the stance information having been obtained by a sensor in communication with the computing device.

* * * * *